(12) United States Patent
Saishu

(10) Patent No.: US 8,970,809 B2
(45) Date of Patent: Mar. 3, 2015

(54) IMAGE DISPLAY APPARATUS AND METHOD OF DRIVING THE SAME

(71) Applicant: Tatsuo Saishu, Tokyo (JP)

(72) Inventor: Tatsuo Saishu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 13/706,791

(22) Filed: Dec. 6, 2012

(65) Prior Publication Data
US 2013/0286059 A1 Oct. 31, 2013

(30) Foreign Application Priority Data

Apr. 27, 2012 (JP) ................................. 2012-103080

(51) Int. Cl.
| | | |
|---|---|---|
| *G02F 1/133* | (2006.01) | |
| *G02B 27/22* | (2006.01) | |
| *G09G 5/00* | (2006.01) | |
| *G02F 1/1333* | (2006.01) | |

(Continued)

(52) U.S. Cl.
CPC ............ *G02B 27/2214* (2013.01); *G09G 5/006* (2013.01); *G02F 1/13336* (2013.01); *H01L 27/3293* (2013.01); *H04N 13/0415* (2013.01); *H04N 13/0404* (2013.01); *G09G 3/32* (2013.01); *G02B 3/0043* (2013.01); *G02B 5/0257* (2013.01); *G02B 5/0278* (2013.01); *G02B 27/1066* (2013.01); *G02B 5/0294* (2013.01); *H04N 2213/001* (2013.01)
USPC ......................................................... 349/73

(58) Field of Classification Search
CPC .......... G02F 1/133611; G02F 1/13336; G02F 1/133606; G02F 1/133526; G02F 1/133504; G02F 2001/133607; G02F 1/1616; G02F 1/1641; G02B 6/003; G02B 6/0078

USPC ......... 349/61, 62, 64, 56, 73, 95; 345/87, 1.3, 345/32, 102, 1.1; 264/1.32
See application file for complete search history.

(56) References Cited

U.S. PATENT DOCUMENTS 7,554,628 B2 6/2009 Mitani et al.
8,572,893 B2 * 11/2013 Watanabe ........................ 49/64

FOREIGN PATENT DOCUMENTS

| | | |
|---|---|---|
| JP | 61-204678 A | 10/1986 |
| JP | 2006-308707 | 11/2006 |

(Continued)

OTHER PUBLICATIONS

Japanese Office Action for Japanese Patent Application No. 2012-103080, dated Mar. 5, 2013.

(Continued)

*Primary Examiner* — Thoi Duong
(74) *Attorney, Agent, or Firm* — Patterson & Sheridan, LLP

(57) ABSTRACT

An image display apparatus according to an embodiment includes: a plurality of panels arranged in a matrix form, each panel having, on its display surface, a plurality of pixels arranged in a matrix form; a first junction portion provided between the panels adjacent to each other in a horizontal direction; a second junction portion provided between the panels adjacent to each other in a vertical direction; a first optical member covering the first junction portion, and magnifying or diffusing the pixels of the panels in the vicinity of the first junction portion with an anisotropy in a first direction; and a second optical member covering the second junction portion, and magnifying and diffusing the pixels of the panels in the vicinity of the second junction portion with an anisotropy in a second direction.

8 Claims, 10 Drawing Sheets

(51) Int. Cl.
    *H01L 27/32*     (2006.01)
    *H04N 13/04*     (2006.01)
    *G09G 3/32*     (2006.01)
    *G02B 3/00*     (2006.01)
    *G02B 5/02*     (2006.01)
    *G02B 27/10*     (2006.01)

(56) References Cited

FOREIGN PATENT DOCUMENTS

| | | |
|---|---|---|
| JP | 2009-042407 | 2/2009 |
| JP | 2009162999 A | 7/2009 |
| JP | 2010-038960 | 2/2010 |
| JP | 2013231813 A | 11/2013 |
| WO | 2008149449 A1 | 12/2008 |
| WO | 2009066436 A1 | 5/2009 |
| WO | 2010140537 A1 | 12/2010 |

OTHER PUBLICATIONS

Japanese Office Action for Japanese Patent Application No. 2013-112290 dated Apr. 4, 2014.

Japanese Office Action for Japanese Application No. 2013-112290, dated Dec. 2, 2014.

\* cited by examiner

IMAGE DISPLAY APPARATUS AND METHOD OF DRIVING THE SAME

CROSS REFERENCE TO RELATED APPLICATIONS

This application is based upon and claims the benefit of priority from prior Japanese Patent Application No. 2012-103080 filed on Apr. 27, 2012 in Japan, the entire contents of which are incorporated herein by reference.

FIELD

Embodiments described herein relate generally to an image display apparatus and a method of driving the same.

BACKGROUND

A number of image display apparatuses are known, in which a plurality of panels are arranged on a plane and connected. In an example of such image display apparatuses, in order to reduce the interference of a junction portion of panels on an image, the junction portion of panels is covered by an optical element such as a lens, a prism, a fiber, and the like, in a manner that the pixel portions of the panels are not covered thereby.

However, in conventional image display apparatuses, it is often performed that the panels are bonded together in one direction, for example, either of the vertical direction and the horizontal direction. No method is known by which the interference on a junction portion is sufficiently reduced in a image display apparatus in which the panels are bonded in two directions.

Furthermore, in a conventional image display apparatus, the junction portions are covered by optical elements without considering the arrangement of color filters provided to each panel. Accordingly, an image at a junction portion can not be normally displayed since a specific color component can be enlarged at the junction portion, resulting in that the interference on the image portion cannot be reduced.

In the technical field of image display apparatuses, in which a plurality of panels capable of performing autostereoscopic display are arranged on a plane and connected, the covering of junction portions by optical elements is not known. Furthermore, a stereoscopic image has a plurality of parallax images, but it is not known what optical element can be used at a junction portion of panels to display the parallax images.

DETAILED DESCRIPTION

An image display apparatus according to an embodiment includes: a plurality of panels arranged in a matrix form, each panel having, on a display surface, a plurality of pixels arranged in a matrix form; a first junction portion provided between panels adjacent to each other in a horizontal direction; a second junction portion provided between panels adjacent to each other in a vertical direction; a first optical member covering the first junction portion, by which the pixels of the panels in the vicinity of the first junction portion are magnified or diffused with an anisotropy in a first direction; and a second optical member covering the second junction portion, by which the pixels of the panels in the vicinity of the second junction portion are magnified or diffused with an anisotropy in a second direction.

Embodiments will now be explained with reference to the accompanying drawings.

First Embodiment

Figure 1:
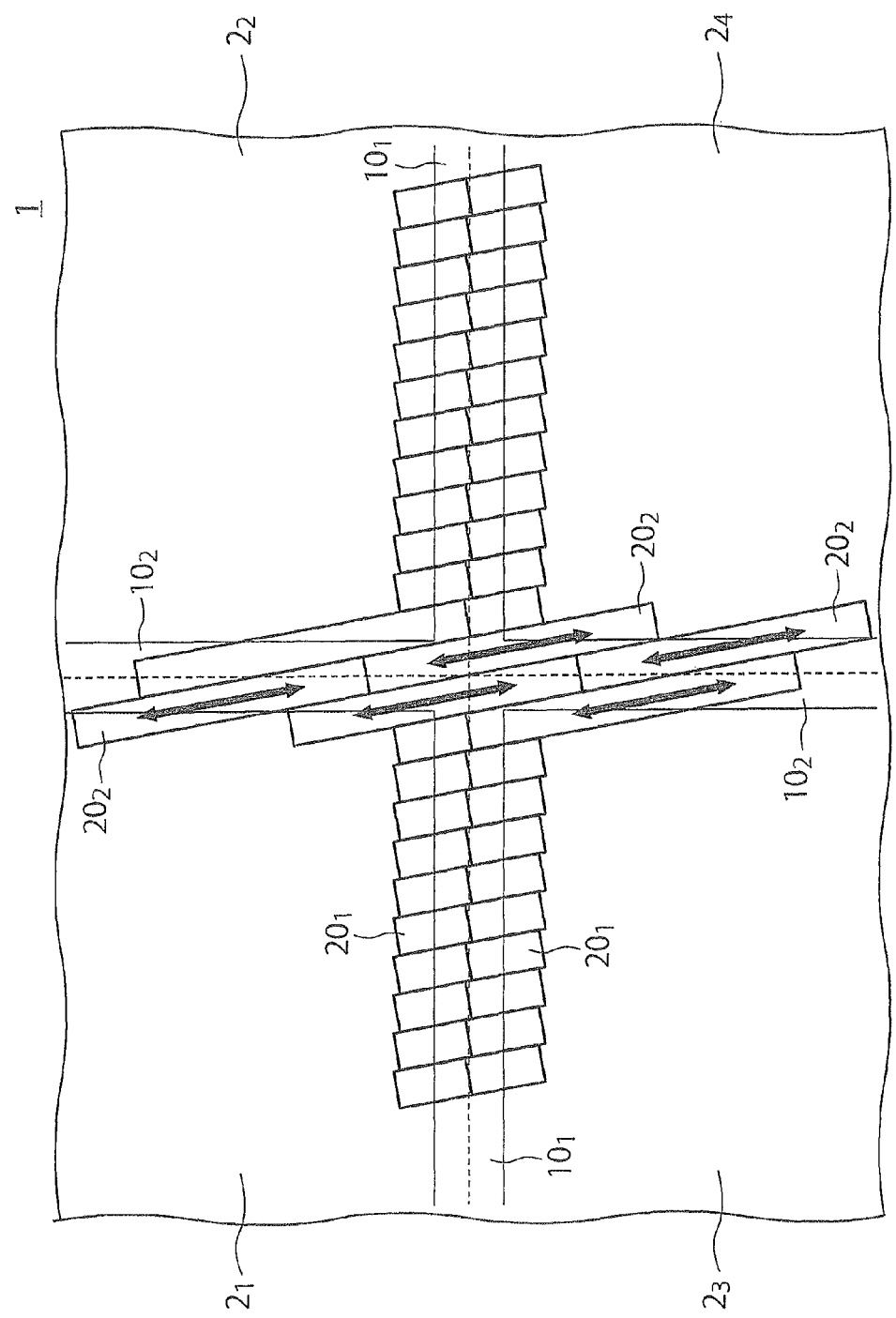
FIG. 1 is a front view of an image display apparatus according to a first embodiment.

FIG. 1 shows an image display apparatus according to a first embodiment. The image display apparatus 1 of this embodiment includes four panels $2_1$-$2_4$, which are arranged in two rows and two columns (2×2). Each panel $2_i$ (i=1–4) has a plurality of pixels including sub pixels of red (R), green (G), and blue (B) arranged in a matrix form on a display surface. As long as the pixels are arranged in a matrix form, a direct viewing liquid crystal display panel, projection liquid crystal display panel, plasma display panel, field emission display panel, or organic EL display panel can also be used.

A junction portion $10_1$ is provided between the panel $2_1$ and the panel $2_3$, and also between the panel $2_2$ and the panel $2_4$, and a junction portion $10_2$ is provided between the panel $2_1$ and the panel $2_2$, and also between the panel $2_3$ and the panel $2_4$. That is to say, the junction portion $10_1$ is a junction portion in the horizontal direction, and the junction portion $10_2$ is a junction portion in the vertical direction. Incidentally, the overlapping portion between the junction portion $10_1$ and the junction portion $10_2$ is made to be the junction portion $10_2$. That is to say, two junction portions $10_1$ are provided at both the sides of the junction portion $10_2$.

Figure 2:
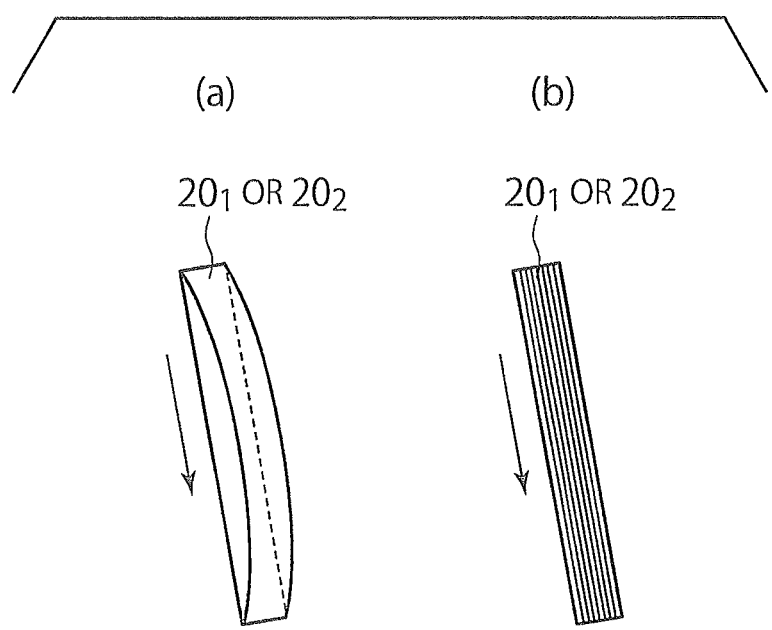
FIGS. 2(a) and 2(b) show optical members used in the first embodiment.

In this embodiment, a plurality of optical members $20_1$ are provided to the junction portions $10_1$ so that the pixels at the edge portions of the panels $2_1$-$2_4$ in the vicinity of the junction portions $10_1$ are magnified or diffused with an anisotropy in one direction. Furthermore, a plurality of optical members $20_2$ are provided to the junction portion $10_2$ so that the pixels at the edge portions of the panels $2_1$-$2_4$ in the vicinity of the junction portion $10_2$ are magnified or diffused with an anisotropy in one direction. In other words, each of the optical members $20_1$ and $20_2$ has an anisotropy with respect to a magnification ratio or diffusion ratio. In FIG. 1, each panel $2_i$ (i=1-4) has an anisotropy in a direction tilted relative to the vertical direction (the column direction of the pixel arrangement). For example, the arrows in the optical members $20_2$ indicate the direction along which the pixels adjacent to the junction portion $10_2$ are magnified or diffused. Incidentally, the optical members $20_1$, $20_2$ are seldom magnified or diffused in a direction perpendicular to the direction along which they are magnified or diffused. At least one pixel at the end portions of the panels $2_1$-$2_4$ is magnified or diffused by each of the optical members $20_1$, $20_2$. For example, cylindrical lenses or anisotropic diffusion films are used as the optical members $20_1$, $20_2$. FIG. 2(a) shows the case where the optical members $20_1$, $20_2$ are cylindrical lenses, and FIG. 2(b) shows the case where the optical members $20_1$, $20_2$ are anisotropic diffusion films. The arrows in FIGS. 2 (a) and 2(b) indicate the direction of anisotropy. As shown in FIG. 2(a), in the case where the optical members $20_1$, $20_2$ are cylindrical lenses, a curved surface or refractive index distribution extends along the direction of the arrow. Although the optical members $20_1$, $20_2$ are only on part of the junction portions $10_1$, $10_2$ in FIG. 1, actually they are on the entire parts of the junction portions $10_1$, $10_2$. Furthermore, although small pieces of optical members are drawn in FIG. 1, they can be integrally formed by connecting a part or the entire parts thereof. Moreover, the end portions thereof can be cut along a line.

Thus, in this embodiment, a plurality of optical members $20_1$, $20_2$ are provided to each of the junction portions $10_1$, $10_2$ extending in the horizontal direction and the vertical direction of the panels $2_1$-$2_4$ in a manner that the pixels of the edge portions of the panels in the vicinity of the junction portions are magnified or diffused with an anisotropy in one direction. Accordingly, it is possible to reduce the interference on the image around the junction portions.

Figure 3:
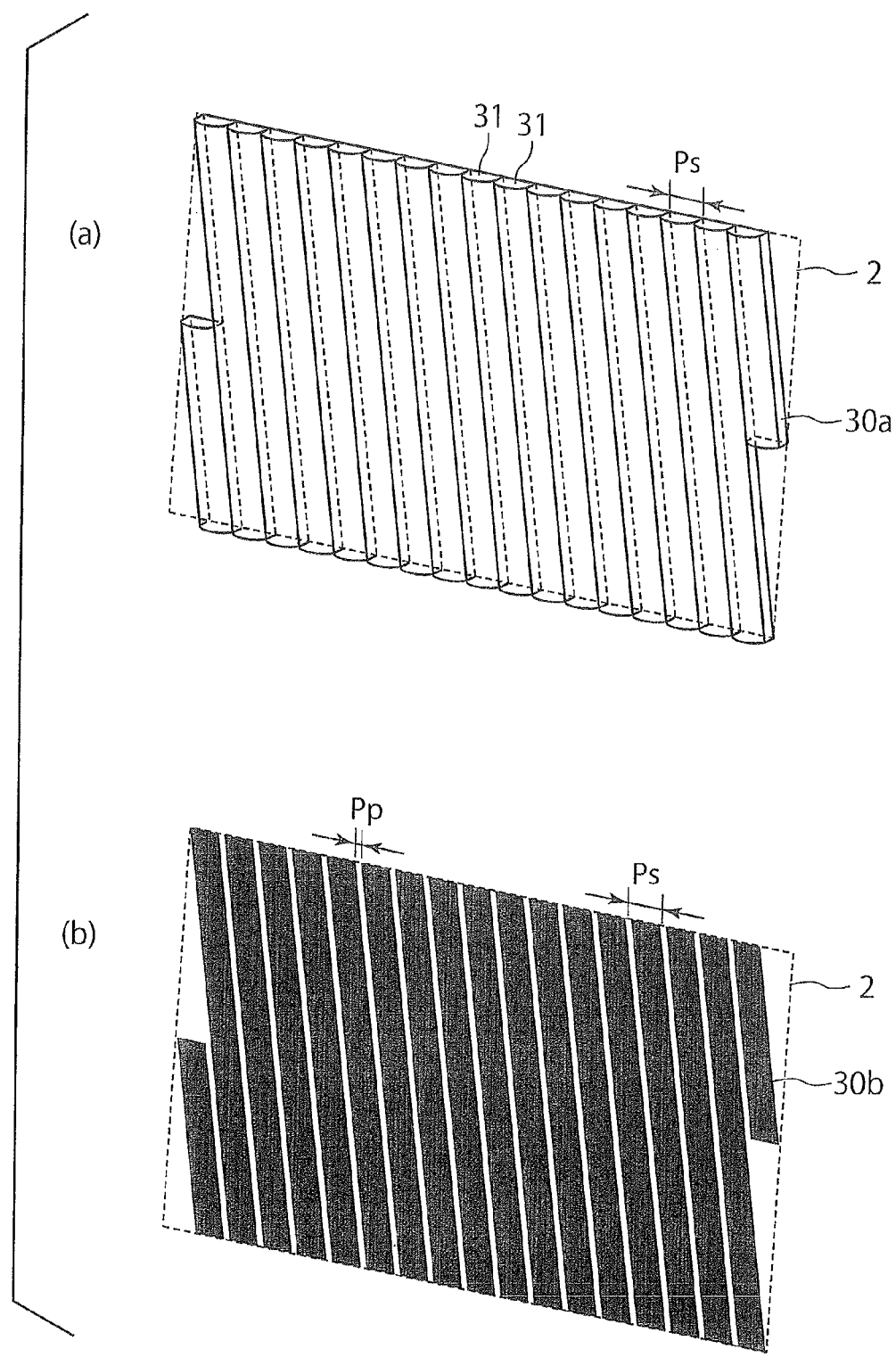
FIGS. 3(a) and 3(b) show specific examples of optical aperture portion for stereoscopic display.

There is a case where an optical aperture portion including optical apertures extending in a direction tilted relative to the vertical direction of the display surface of the panels are arranged in front of each panel so that each of the panels $2_i$ (i=1-4) can perform an autostereoscopic display. In such a case, the optical aperture portion is arranged to be closer to the display surface of each panel than the optical member in a manner that the direction along which the optical apertures extend is along the direction indicated by the arrows shown in FIG. 1 (the direction indicating the anisotropy of the optical members). Examples of such an optical aperture portion are, a lenticular sheet (cylindrical lens array) and a parallax barrier. FIG. 3(a) is a perspective view showing a case where the optical aperture portion is a lenticular sheet 30a including a plurality of cylindrical lenses 31, and FIG. 3(b) is a perspective view showing a case where the optical aperture portion is a parallax barrier 30b. In each of FIGS. 3 (a) and 3(b), 2 indicates a panel, and Ps indicates the pitch of the optical aperture portion. Furthermore, in FIG. 3(b), Pp indicates the size of each aperture of the parallax barrier 30b. When the optical aperture portion is the lenticular sheet 30a, the lenticular sheet 30a is placed closer to the display surface of the panel than the optical members in a manner that the edge lines of the cylindrical lenses 31 included in the lenticular sheet 30a are along the direction of the arrows shown in FIG. 1 (the direction indicating that of the anisotropy of the optical members). It is not necessary that the width of each optical member $20_1$ (i=1-4) matches the pitch of the cylindrical lenses or parallax barrier for autostereoscopic viewing.

Thus, in the case where it is possible for each panel $20_i$ (i=1-4) to perform autostereoscopic display with parallaxes only in the horizontal direction using the lenticular sheet, it is preferable that the one direction along which the pixels are magnified or diffused by the optical members $20_1$, $20_2$ be the direction in which there is no parallax, e.g., the edge direction of the cylindrical lenses or the direction of the apertures of the parallax barrier. The lenticular sheet or parallax barrier for autostereoscopic display can be an active lens or active barrier. An active lens has a function of a lens when displaying a stereoscopic image, and a function of linearly passing a light when displaying a two-dimensional image. An active barrier has a function of a barrier when displaying a stereoscopic image, and a function of passing a light when displaying a two-dimensional image.

Although FIG. 1 shows the structure in which the panels are arranged in 2 rows and 2 columns (2×2), it is possible to arrange them in 3 rows and 3 columns (3×3) or more.

By arranging the aforementioned optical aperture portion in front of the panels, it is possible to provide a parallax to the junction portions in the autostereoscopic display, and thus it is possible to prevent the junction portions from interfering the stereoscopic viewing.

Second Embodiment

Figure 4:
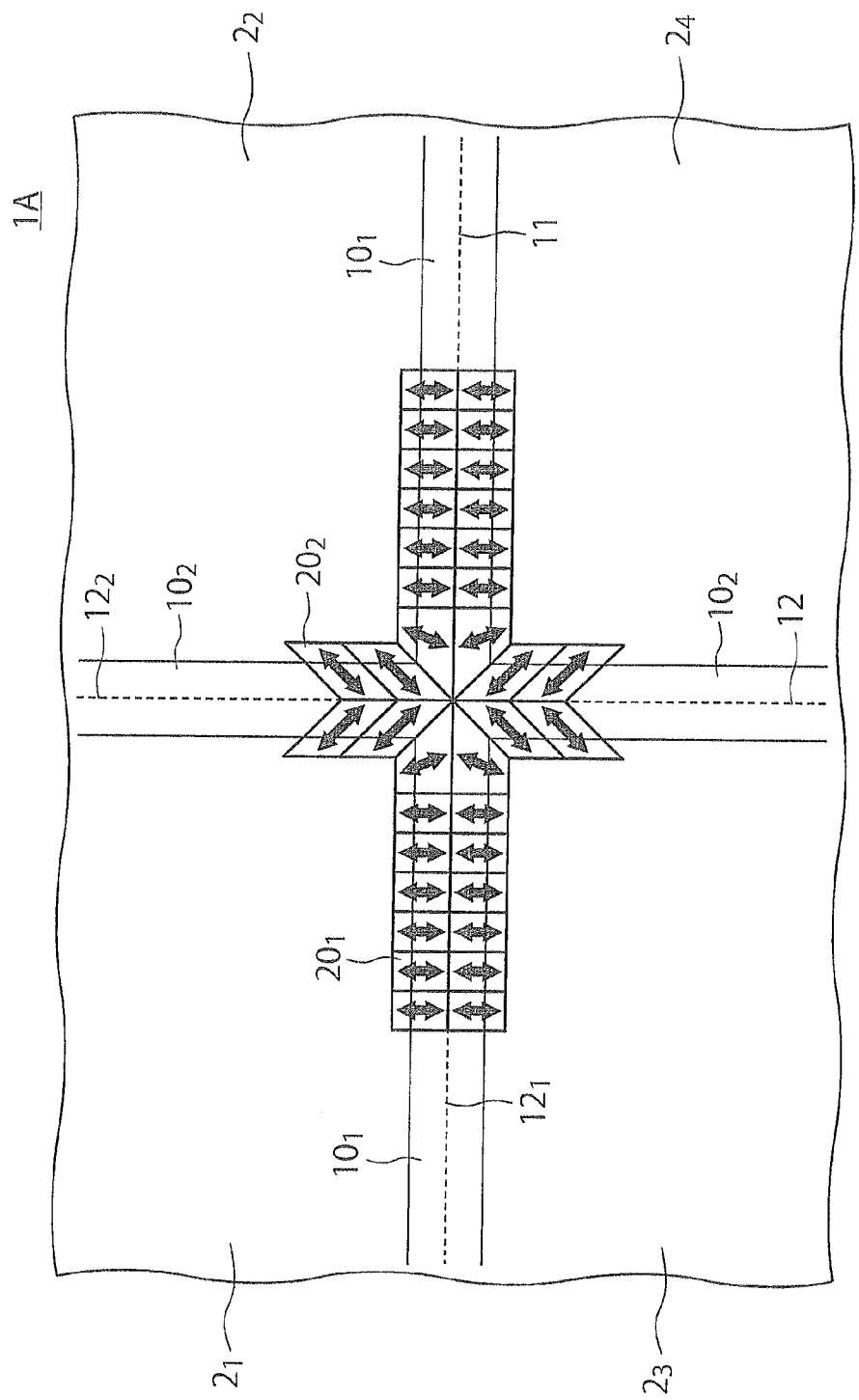
FIG. 4 is a front view of an image display apparatus according to a second embodiment.

FIG. 4 shows an image display apparatus according to a second embodiment. Like the image display apparatus according to the first embodiment shown in FIG. 1, the image display apparatus 1A of the second embodiment includes four panels $2_1$-$2_4$, which are arranged in 2 rows and 2 columns (2×2). However, this image display apparatus according to the second embodiment is not for autostereoscopic display. In the second embodiment, color filters in the form of vertical stripes are arranged on the display surface of each panel $2_i$ (i=1-4). Specifically, R pixels, G pixels, and B pixels are arranged in the vertical direction on the display surface. Accordingly, around the junction portion $10_2$ for connecting the panels arranged in the horizontal direction, the color arrangement of the display surface of the panels is parallel to the edges of the display surfaces. If the pixels in the vicinity of the junction portion $10_2$ are magnified in the horizontal direction using the optical members, the color components are magnified, resulting in that the color definition is considerably degraded.

Figure 5:
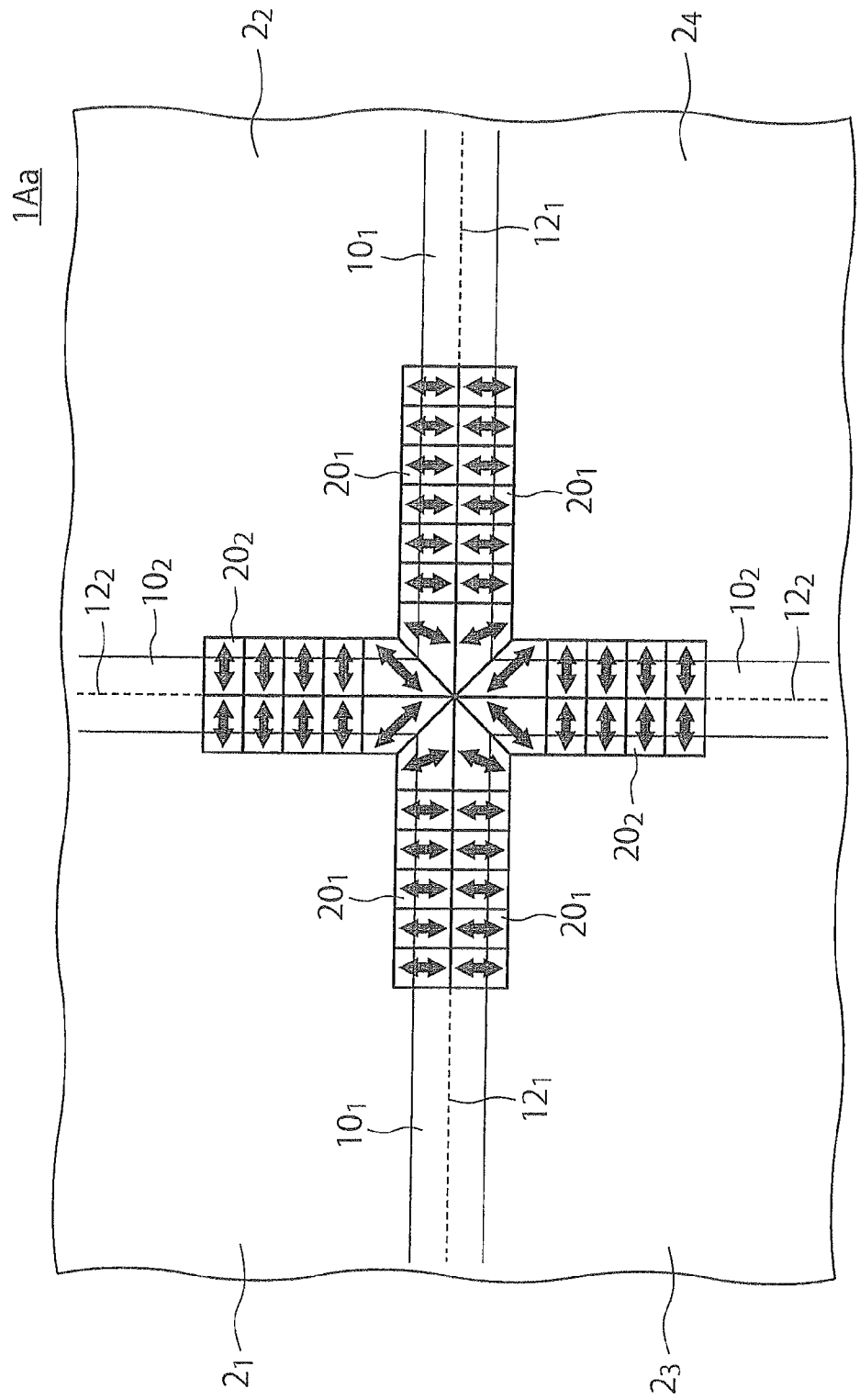
FIG. 5 is a front view of an image display apparatus according to a modification of the second embodiment.

In order to solve this, in the second embodiment, the optical members $20_1$ arranged on the junction portions $10_1$ magnify or diffuse the pixels of the panels in the vicinity of the optical members $20_1$ in the vertical direction, and the optical members $20_2$ arranged on the junction portion $10_2$ magnify or diffuse the pixels in a diagonal direction, as shown in FIG. 4. Specifically, for example, cylindrical lenses or anisotropic diffusion films are used as the optical members $20_1$, and for example, cylindrical lenses are used as the optical members $20_2$. It is also possible to use anisotropic diffusion films as the optical members $20_2$ as a modification of the second embodiment. In the image display apparatus 1Aa of the modification, the pixels in the vicinity of the junction portion $10_2$ for connecting the panels arranged in the horizontal direction are magnified in the horizontal direction as shown in FIG. 5. There is no problem in magnifying, in the horizontal direction, the pixels in the vicinity of the junction portion $10_2$ for connecting the panels arranged in the horizontal direction as in this modification. The structure of this modification is simple, and the increase in thickness would not be much. However, if the magnification is performed by using lenses, it is possible to perform a display of a few pixels in the magnifying direction in the magnified portion. It is possible to perform a display with the color definition that is the same as the pixel pitch of the display surface of the panel in the non-magnified direction (the direction perpendicular to the magnifying direction). Thus, it is possible to curb the decrease in color definition to the minimum level.

As shown in FIGS. 4 and 5, in this second embodiment, the anisotropic properties or shapes of the optical members at the corner portion common to the four panels $2_1$-$2_4$ differ, or change from those of one of the optical members $20_1$ and $20_2$ to the other. For example, a structure in which the thickness of the lenses or distances or angles from the display surface change, a structure in which the angles of prisms or mirrors change, a structure in which at least one of the direction and the strength of anisotropy of the anisotropic diffusion films changes, and the like can be employed. Although the optical members $20_1$, $20_2$ are on a part of the junction portions $10_1$, $10_2$ in FIGS. 4 and 5, actually they are on the entire parts of the junction portions $10_1$, $10_2$. Furthermore, although small pieces of optical members are drawn in FIGS. 4 and 5, they can be integrally formed by connecting a part or the entire parts thereof.

Thus, in the second embodiment, the optical members $20_1$ and $20_2$ are arranged to be point-symmetric with respect to the intersection of the central line $12_1$ of the junction portions $10_1$ and the central line $12_2$ of the junction portion $10_2$. Furthermore, the optical members $20_1$ and $20_2$ are arranged to be axisymmetric with respect to the central line $12_1$ of the junction portions $10_1$, and to be axisymmetric with respect to the central line $12_2$ of the junction portion $10_2$.

As described above, like the first embodiment, in the second embodiment, a plurality of optical members $20_1$, $20_2$ are provided to the junction portions $10_1$, $10_2$ extending in the horizontal direction or vertical direction between the panels $2_1$-$2_4$ in a manner that the pixels at the edge portions of the panels in the vicinity of each junction portion are magnified or diffused with an anisotropy in one direction. Accordingly, it is possible to reduce the interference on an image at the junction portion.

Third Embodiment

Figure 6:
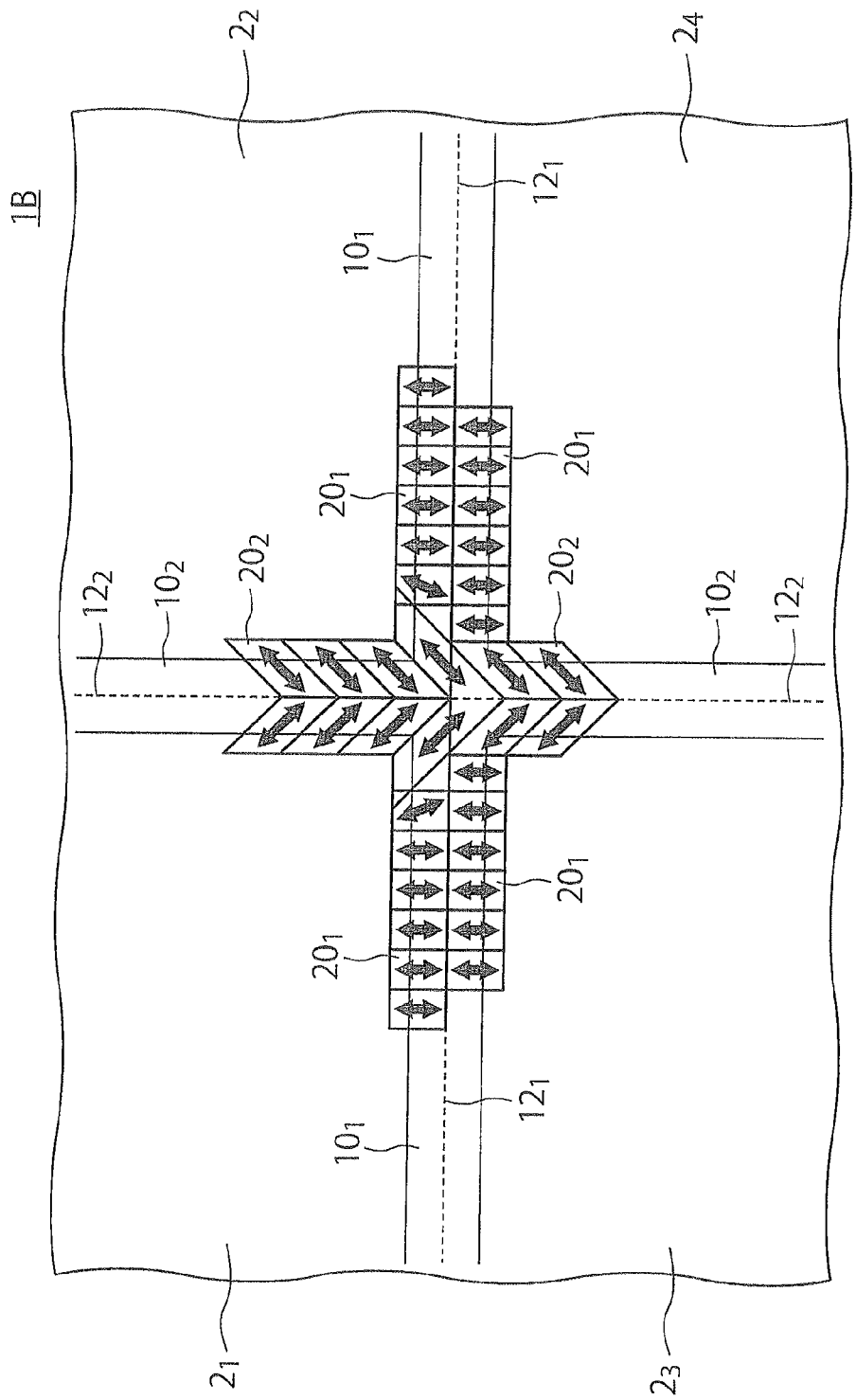
FIG. 6 is a front view of an image display apparatus according to a third embodiment.

FIG. 6 shows an image display apparatus according to a third embodiment. The image display apparatus 1B of the third embodiment has a structure in which panels dedicated for two-dimensional display, which are not for autostereoscopic display, are arranged in an array of 3 rows and 3 columns (3×3) or more. FIG. 6 shows four panels $2_1$-$2_4$ arranged in 2 rows and 2 columns. Like the first or second embodiment, in the third embodiment, optical members $20_1$ are provided to the junction portions $10_1$, and optical members $20_2$ are provided to the junction portion $10_2$. The optical members $20_1$, $20_2$ are arranged to be axisymmetric with respect to the central line $12_2$ of the junction portion $10_2$. However, unlike the second embodiment, the optical members $20_1$, $20_2$ are not arranged to be point-symmetric with respect to the intersection of the central line $12_1$ of the junction portions $10_1$ and the central line $12_2$ of the junction portion $10_2$. That is to say, the optical members $20_1$ have a function of magnifying or diffusing the pixels in the vertical direction. The optical members $20_1$ arranged above and below the central line $12_1$ of the junction portions $10_1$ have a function of magnifying of diffusing the pixels in a direction parallel to the vertical direction of the panels. Furthermore, the optical members $20_1$ arranged above and below the central line $12_1$ of the junction portions $10_1$ are axisymmetric with respect to the central line $12_1$.

On the other hand, the optical members $20_2$ located on the left side of the central line $12_2$ of the junction portion $10_2$ have a function of magnifying or diffusing the pixels in, for example, a direction connecting the upper left end and the lower right end a panel, and the optical member $20_2$ located on the right side of the central line $12_2$ of each junction portion $10_2$ have a function of magnifying or diffusing pixels in, for example, a direction connecting the upper right end and the lower left end of a panel. Although the optical members $20_1$, $20_2$ are on a part of the junction portions $10_1$, $10_2$ in FIG. 6, actually they are on the entire parts of the junction portions $10_1$, $10_2$. Furthermore, although small pieces of optical members are drawn in FIG. 6, they can be integrally formed by connecting a part or the entire parts thereof.

Thus, in the third embodiment, the optical members $20_1$, $20_2$ are arranged to be axisymmetric with respect to the central line $12_2$ of the junction portion $10_2$, but not arranged to be point-symmetric with respect to the intersection of the central line $12_1$ of the junction portions $10_1$ and the central line $12_2$ of the junction portion $10_2$. Accordingly, this embodiment can be used in the case where 3×3 or more panels are connected to each other. The image display apparatus of the second embodiment shown in FIG. 4 or its modification shown in FIG. 5 can deal with the case where 2×2 panels are connected to each other, but cannot deal with the case where 3×3 or more panels are connected with each other.

As described above, like the first embodiment, in the third embodiment, a plurality of optical members $20_1$, $20_2$ are provided to each of the junction portions $10_1$ and $10_2$ extending in the horizontal direction or vertical direction of the panels $2_1$-$2_4$ in a manner that the pixels at the edge portions of the panels in the vicinity of the junction portions are magnified or diffused with an anisotropy in one direction. Accordingly, it is possible to reduce the interference on an image on the junction portion.

Figure 7:
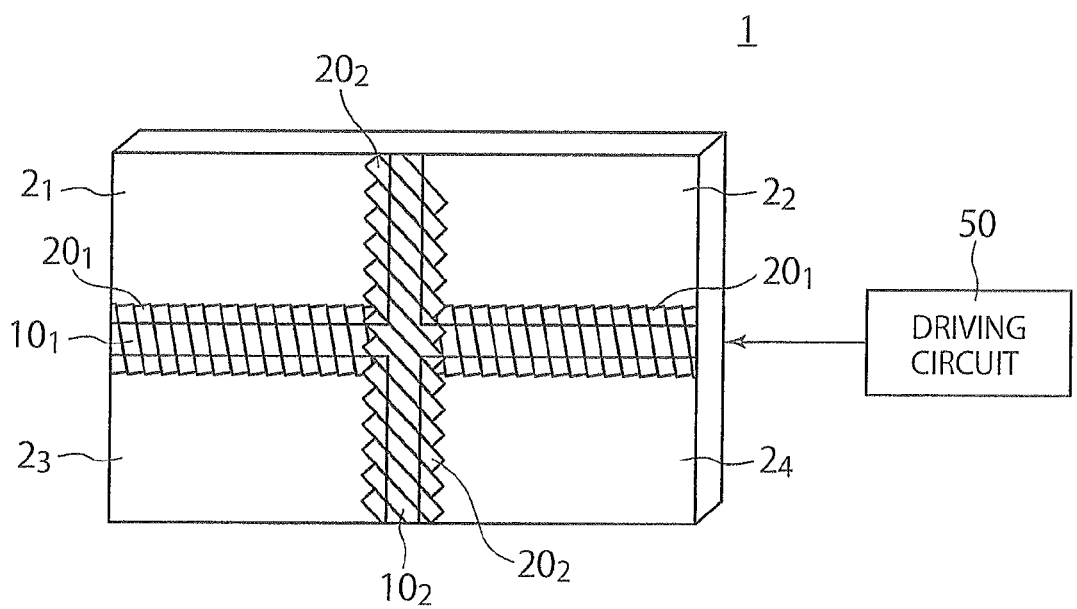
FIG. 7 is for explaining a driving circuit used in the respective embodiments.

In the image display apparatuses of the first to the third embodiments and their modifications, an image at an edge portion of a display surface of a panel and the brightness range thereof are processed in a manner that an interpolated image is displayed on a magnified portion. As shown in FIG. 7, this process is performed by a driving circuit 50 for driving the image display apparatus, for example, the image display apparatus 1. The driving circuit 50 can be included in the image display apparatus 1. When the brightness of a pixel is decreased due to the existence of an optical member, the driving circuit 50 performs a process by which the brightness of an image relating to such a pixel is increased. If the respective panels are liquid crystal display panels, the increase in brightness can be performed by correcting the intensity of a backlight. For example, a light source can be additionally provided to increase the brightness of the backlight only on an edge portion.

Figure 8:
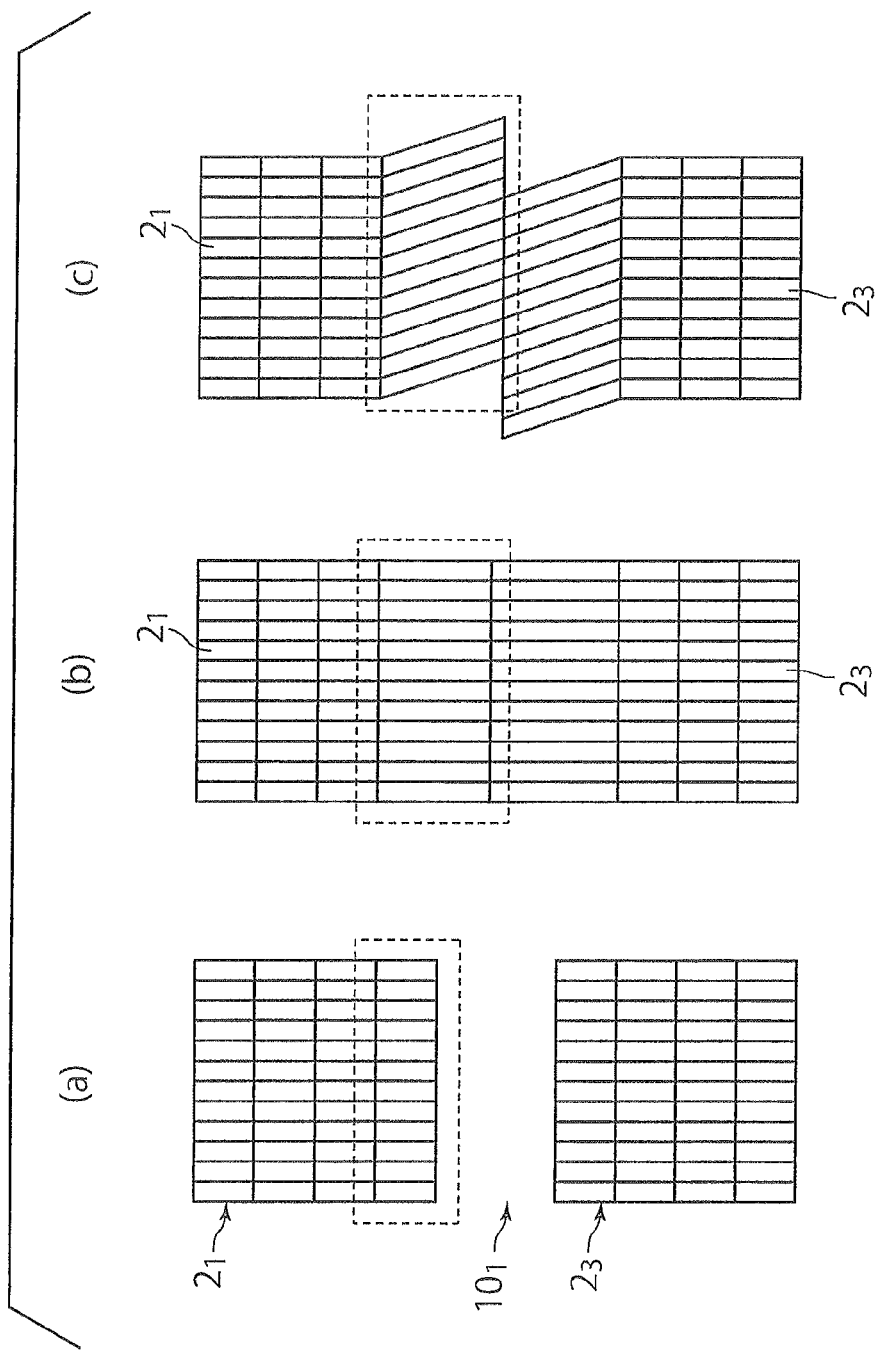
FIGS. 8(a) to 8(c) are for explaining the case where pixels at edge portions of panels arranged adjacent to each other in a vertical direction are magnified.

As shown in FIG. 8(a), in the first to the third embodiments and their modifications, panels adjacent to each other in the vertical direction, for example the panels $2_1$ and $2_3$, are arranged above and below the junction portion $10_1$. The pixels of the panel $2_1$ adjacent to the junction portion $10_1$, for example the pixels surrounded by a broken line in FIG. 8(a), are magnified by the optical members as shown in FIG. 8(b) or 8(c). FIG. 8(b) shows the case of the image display apparatus according to the second embodiment, its modification, or third embodiment, and FIG. 8(c) shows the case of the image display apparatus according to the first embodiment. Therefore, image processing for averaging images in the magnified area and displaying the averaged images on the magnified pixels should be performed. This image processing can be performed by the driving circuit 50 shown in FIG. 7. The pixels to be magnified can be on a plurality of rows. If the magnification is performed by using lenses, as long as an appropriate defocusing is performed, it is possible to display a few pixels in the magnifying direction in the magnified area. Thus, if a few pixels are displayed in the magnifying direction, image processing for averaging images in the respective magnified areas and displaying the averaged images in the magnified pixels is performed. Such image processing can also be performed by the driving circuit shown in FIG. 7.

Figure 9:
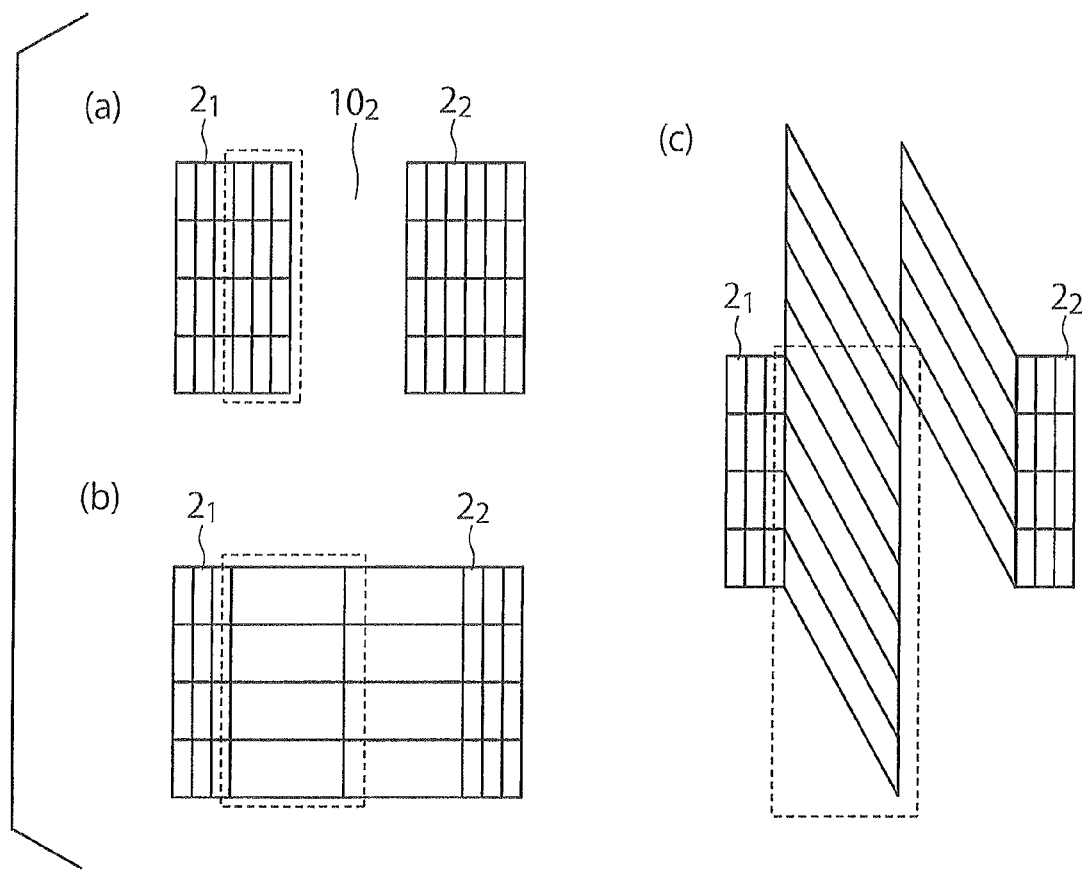
FIGS. 9(a) to 9(c) are for explaining the case where pixels at edge portions of panels arranged adjacent to each other in a horizontal direction are magnified.

In the aforementioned first to third embodiments and their modifications, panels adjacent to each other in the horizontal direction, e.g., the panels $2_1$, $2_2$, are located on the right and the left of the junction portion $10_2$, as shown in FIG. 9(a) The pixels of the panel $2_1$ adjacent to the junction portion $10_2$, for example, the pixels surrounded by a broken line in FIG. 9(a), are magnified by the optical members as shown in FIG. 9(b) or FIG. 9(c). FIG. 9(b) shows the case of the image display apparatus according to the second embodiment or its modification, and FIG. 9(c) shows the case of the image display apparatus according to the first embodiment, second embodiment, or third embodiment. Accordingly, image processing for averaging images in the magnified area and displaying the averaged images on the magnified pixels is performed. Such image processing can be performed by the driving circuit 50 shown in FIG. 7.

Since the optical members $20_1$, $20_2$ have a certain degree of thickness, a user (viewer) can view them in different ways due to parallaxes caused by the positions of the user. In order to prevent this, a user tracking system, in which a camera is provided to a panel to detect the user's position, can be employed to correct the contents of processing depending on the position of the user. Such correction processing can be performed by the driving circuit shown in FIG. 7.

Figure 10:
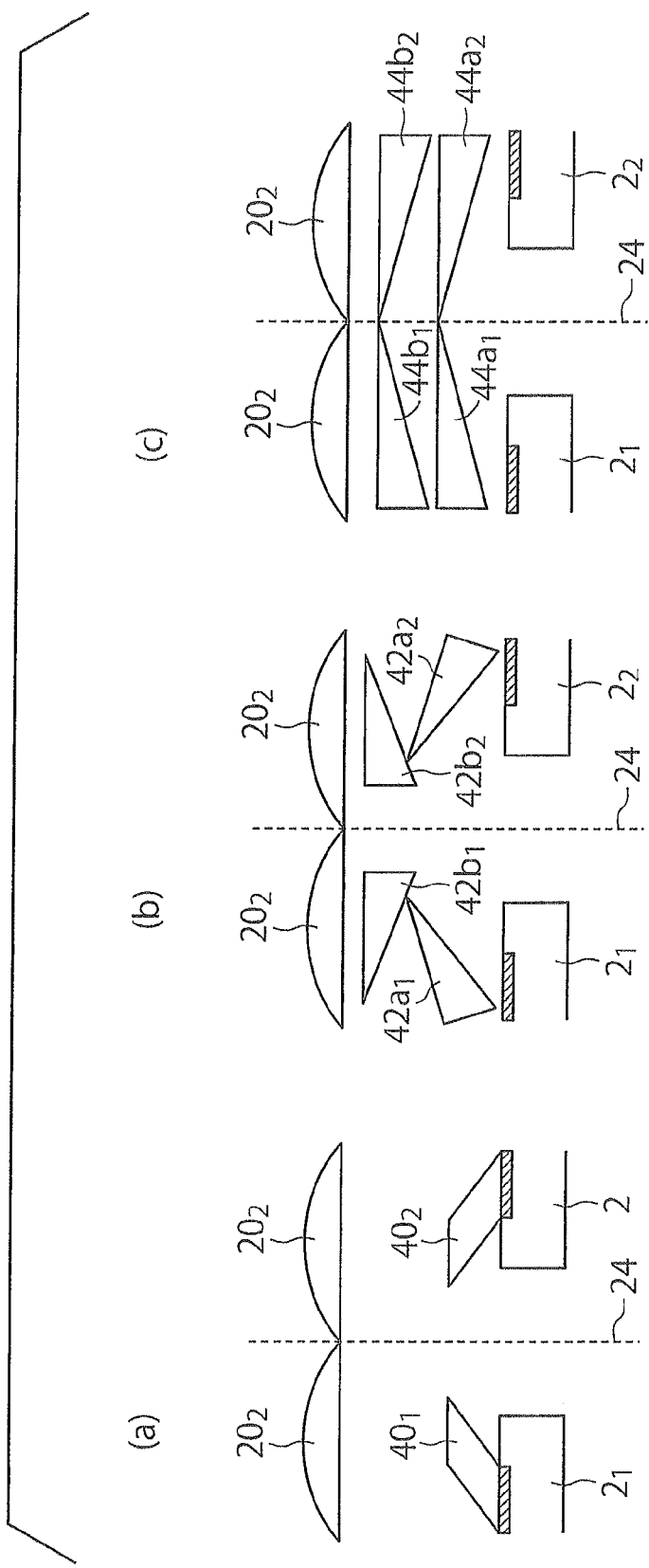
FIGS. 10(a) to 10(c) are for explaining modifications of the respective embodiments, in each of which cylindrical lenses are used as optical members in an image display apparatus.

FIGS. 10(a) to 10(c) show modifications of any of the first to the third embodiments, in each of which a cylindrical lens array (lenticular sheet) is used as optical members of the image display apparatus. FIGS. 10(a) to 10(c) each show a cross-sectional view near the optical members in each modification. In each of FIGS. 10(a) to 10(c), the hatched portions indicate display areas (upper, lower, left, or right end) of the panels $2_1$, $2_2$, and the vertical broken line 24 is a boundary line between the two optical members (cylindrical lenses) $20_1$ and $20_2$. Besides the cylindrical lenses serving as the optical members, a rhomboid prism pair or mirror pair corresponding thereto $40_1$, $40_2$ can be provided as shown in FIG. 10(a). Furthermore, as shown in FIG. 10(b), an anamorphic prism pair $42a_1$, $42b_1$ and $42a_2$, $42b_2$ can be provided. Moreover, as shown in FIG. 10(c), wedge prisms $44a_1$, $44b_1$ and $44a_2$, $44b_2$ can be provided. By providing such optical elements between the cylindrical lenses and the display surfaces of the panels, it is possible to shift the optical axes of the cylindrical lenses. In addition, a diffusing layer can also be provided above or below the cylindrical lenses. In such a case, the viewing area can be expanded.

In the first to the third embodiments and their modifications described above, the state where the junction portions can be seen (the respective screens are not coupled but independently display images) and the state where the junction portions cannot be seen (the respective screens are coupled to be used as a single large screen) can be switched by using an active lens (liquid crystal GRIN lens etc.), an active prism, an active diffusion layer (PDLC), an attaching and detaching structure, and the like as the optical members.

If a color (filter) arrangement other than the stripe arrangement (mosaic, pen tile, etc.) is used, it is possible to obtain a structure in which the optical members are not diagonally arranged, as shown in FIG. 5. Thus, a simple structure can be obtained.

As described above, according to the respective embodiments and their modifications, a plurality of optical members $20_1$, $20_2$ are provided to the junction portions $10_1$, $10_2$ extending in the horizontal direction or vertical direction between the panels $2_1$-$2_4$ in a manner that the pixels at the edge portions of the panels at the respective junction portions are magnified or diffused with an anisotropy in one direction. Accordingly, it is possible to reduce the interference on images on the junction portions.

Furthermore, no specific color is magnified. Thus, it is possible to curb a considerable decrease in definition even in a panel located in the central portion of a 3×3 arrangement.

If autostereoscopic image display panels are used, it is possible to provide a parallax onto a junction portion.

Furthermore, it is possible to reduce the interference on a junction portion without using special and expensive optical members.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. An image display apparatus comprising:
   a plurality of panels arranged in a matrix form, each panel having, on a display surface, a plurality of pixels arranged in a matrix form;
   a first junction portion provided between the panels adjacent to each other in a horizontal direction;
   a second junction portion provided between the panels adjacent to each other in a vertical direction;
   a first optical member covering the first junction portion and magnifying or diffusing, with an anisotropy in a first direction, the pixels of the panels in the vicinity of the first junction portion, and
   a second optical member covering the second junction portion and magnifying, with an anisotropy in a second direction, the pixels of the panels in the vicinity of the second junction portion,
   wherein:
   the first direction of the first optical member is tilted relative to a vertical direction of the panels; and
   the second direction of the second optical member is tilted relative to the vertical direction of the panels.

2. The image display apparatus according to claim 1, wherein an optical aperture portion is provided to the display surface of each of the plurality of panels.

3. An image display apparatus comprising:
   a plurality of panels arranged in a matrix form, each panel having, on a display surface, a plurality of pixels arranged in a matrix form;
   a first junction portion provided between the panels adjacent to each other in a horizontal direction;
   a second junction portion provided between the panels adjacent to each other in a vertical direction;
   a first optical member covering the first junction portion and magnifying or diffusing, with an anisotropy in a first direction, the pixels of the panels in the vicinity of the first junction portion; and
   a second optical member covering the second junction portion and magnifying, with an anisotropy in a second direction, the pixels of the panels in the vicinity of the second junction portion,
   wherein:
   the first optical member is arranged to be axisymmetric with respect to a central line of the first junction portion;

the second optical member is arranged to be axisymmetric with respect to a central line of the second junction portion; and the first and the second optical members are arranged to be point-symmetric with respect to an intersection of the central line of the first junction portion and the central line of the second junction portion, and wherein:

the plurality of panels are four panels arranged in 2 rows and 2 columns;

the first direction is parallel to the vertical direction of the panels; and the second direction is tilted relative to the vertical direction of the panels.

4. The image display apparatus according to claim 3, wherein each of the first and the second optical members is a cylindrical lens.

5. An image display apparatus comprising:

a plurality of panels arranged in a matrix form, each panel having, on a display surface, a plurality of pixels arranged in a matrix form;

a first junction portion provided between the panels adjacent to each other in a horizontal direction;

a second junction portion provided between the panels adjacent to each other in a vertical direction;

a first optical member covering the first junction portion and magnifying or diffusing, with an anisotropy in a first direction, the pixels of the panels in the vicinity of the first junction portion; and a second optical member covering the second junction portion and magnifying, with an anisotropy in a second direction, the pixels of the panels in the vicinity of the second junction portion, wherein the first and the second optical members are arranged to be axisymmetric with respect to a central line of the second junction portion, and the first and the second optical members are not arranged to be point-symmetric with respect to an intersection of a central line of the first junction portion and the central line of the second junction portion.

6. The image display apparatus according to claim 5, wherein:

the plurality of panels include nine or more panels arranged in at least 3 rows and 3 columns;

the first direction is parallel to the vertical direction of the panels; and the second direction is tilted relative to the vertical direction of the panels.

7. The image display apparatus according to claim 5, wherein:

the first optical member includes a first sub optical member located above the central line of the first junction portion, and a second sub optical member located below the central line of the first junction portion;

each of the first and the second sub optical members has a function of magnifying or diffusing pixels in a direction parallel to the vertical direction of the panels, and the first and the second sub optical members are arranged to be axisymmetric with respect to the central line of the first junction portion;

the second optical member includes a third sub optical member located on the left side of the central line of the second junction portion, and a fourth sub optical member located on the right side of the central line of the second junction portion;

the first sub optical member has a function of magnifying or diffusing pixels in a direction connecting an upper left end and a lower right end of the panels; and the second sub optical member has a function of magnifying or diffusing pixels in a direction connecting an upper right end and a lower left end of the panels.

8. The image display apparatus according to claim 5, wherein the first and the second optical members are cylindrical lenses.

* * * * *